United States Patent [19]
Haseyama et al.

[11] Patent Number: 6,033,233
[45] Date of Patent: Mar. 7, 2000

[54] ELECTRICAL CONNECTING DEVICE, AND SEMICONDUCTOR DEVICE TESTING METHOD

[75] Inventors: Makoto Haseyama, Inagi; Masaru Tateishi, Kawasaki, both of Japan

[73] Assignee: Fujitsu Limited, Kawasaki, Japan

[21] Appl. No.: 09/104,332

[22] Filed: Jun. 25, 1998

[30] Foreign Application Priority Data

Nov. 28, 1997 [JP] Japan .................................. 9-329106

[51] Int. Cl.[7] .................................................. H01R 9/09
[52] U.S. Cl. ............................................. 439/66; 439/515
[58] Field of Search ................. 439/66, 91, 515

[56] References Cited

U.S. PATENT DOCUMENTS

| 4,029,375 | 6/1977 | Gabrielian | 439/66 |
| 4,199,209 | 4/1980 | Cherian et al. | 439/515 |
| 5,174,763 | 12/1992 | Wilson | 439/66 |
| 5,791,914 | 8/1998 | Loranger et al. | 439/66 |

OTHER PUBLICATIONS

IBM Technical Disclosure Bulletin, Vl. 33, No. 5, Oct. 1990.

*Primary Examiner*—Steven L. Stephan
*Assistant Examiner*—T C Patel

[57] ABSTRACT

An electrical connecting device and related method of testing a semiconductor device which provides for testing of a semiconductor device under excellent and stable current transfer characteristics. Moreover, the electrical connecting device is easily produced under mass production conditions and can be made with a structure for testing of a semiconductor device where there are many pins arranged in a fine pitch on the semiconductor device. The electrical connector device includes a contactor which has a coil-shaped spring and a transformable conductive member extending in the compressing direction of the coil-shaped spring. When one end of the conductive member is in contact with a first electrode and the other end of the conductive members in contact with the second electrode, the contactor electrically connects between the first electrode and the second electrode via the conductive member and generates contact pressure against the electrodes when the coil-shaped spring is pressed. A guide plate is provided in the electrical connector device having a through hole for inserting and positioning the contactor therein. In a preferred embodiment, the semiconductor device to be tested has the first electrode for contact against one end of the conductive member of the contactor. The second electrode is a land pattern in a substrate of the electrical connecting device contacting the other end of the transformable conductive member, with the land pattern in turn being connected to testing equipment for testing of the semiconductor device.

22 Claims, 11 Drawing Sheets

ELECTRICAL CONNECTING DEVICE, AND SEMICONDUCTOR DEVICE TESTING METHOD

CROSS-REFERENCE TO RELATED APPLICATIONS

This application is based upon and claims priority of Japanese Patent Application No. 09-329106, filed Nov. 28, 1997, the contents being incorporated herein by reference.

BACKGROUND OF THE INVENTION

The present invention generally relates to an electrical connecting mechanism for a semiconductor device and other electrical elements and more particularly to a connecting device for electrical connection to an IC package in which many pins are arranged with a fine pitch, or a high speed, high frequency IC, such as a bare chip, wafer or other electrical element.

A contactor, such as a probe pin, has generally been used as a device for electrical connection to a semiconductor device and other electrical elements, particularly for testing purposes.

Figure 1:
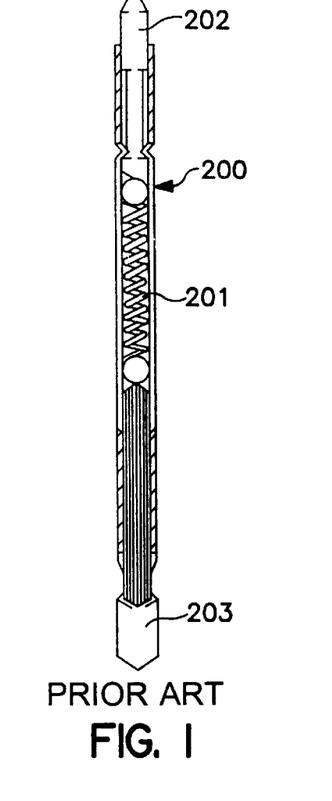
FIG. 1 is a diagram showing a structure of a probe pin in the related art.

FIG. 1 is a diagram showing a structure of a probe pin in the related art. The probe pin shown in FIG. 1 includes a metal tube or pipe 200, a coil-shape spring 201, a metal end piece 202 and a terminal portion 203. The coil-shape spring 201 is provided within the metal pipe 200 and the metal end piece 202 is spring-biased in the upward direction of the drawing by the spring force of the coil-shape spring 201. The metal end piece 202 is provided to establish an electrical connection with an external electrode of a semiconductor device as the object of the test and the spring force produces a contact pressure between the metal end piece 202 and the external electrode. The terminal portion 203 is connected to testing equipment for testing the semiconductor device.

In the probe pin shown in FIG. 1, when the metal end piece 202 is in contact with an external electrode of the semiconductor device, a current flows to the terminal portion 203 via the metal tube or pipe 200 from the metal end piece 202. Therefore, the probe pin itself must be formed in a fine structure in order to provide many of these pins arranged to correspond with an IC package with many external electrodes arranged in a fine pitch. However, since the probe pin has a comparatively complicated structure, it is difficult to manufacture a fine probe pin. Moreover, even if such a fine probe is formed, it becomes very expensive.

Figure 2:
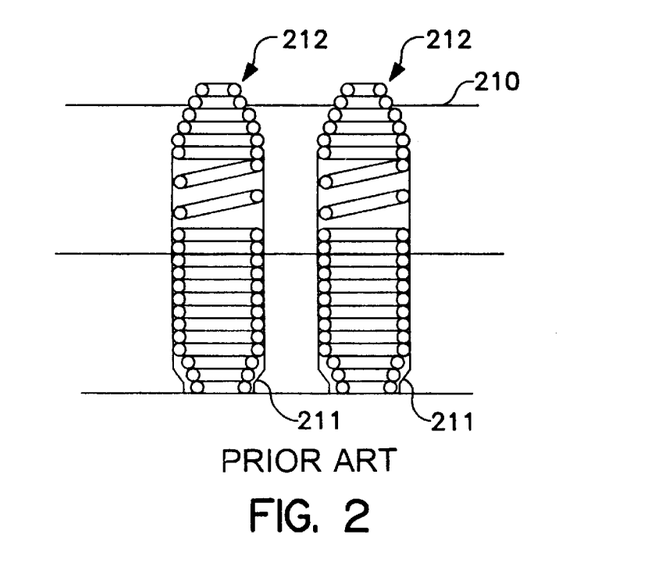
FIG. 2 is a diagram showing another structure of a probe pin in the related art.

Therefore, a probe pin as shown in FIG. 2 tends to be used recently. The probe pin of FIG. 2 includes a guide plate 210, a plurality of holes 211 provided in the guide plate 210 and a plurality of coil-shape springs 212 inserted into the holes 211. One end of the coil-shape spring 212 to be used as a contactor is placed in contact with an external electrode of a semiconductor device, while the other end of the spring 212 is connected to a testing apparatus. This type of probe pin is formed in a simplified structure and therefore many coil-shape springs 212 can be arranged with a fine pitch.

In the probe pin having the structure shown in FIG. 2, a current is transferred via the coil-shape spring 212. If a certain turn of the coil-shape spring 212 is not kept in contact with the next single turn, a current is transferred through a spiral path of metal wire of the coil-shape spring. Therefore, a problem arises that resistance and inductance become large.

In the case of the structure of the probe pin shown in FIG. 2 where a certain turn of the coil-shape spring 212 is in contact with the next single turn in many areas, resistance and inductance can be lowered. However, in this case, when the coil-shape spring 212 is compressed by a contact pressure from the external electrode, the contact condition of a certain turn and the next single turn changes, thereby resulting in a delicate change of a current transfer route. Therefore, a problem arises that fluctuation is generated in the current transfer characteristic in the contact condition.

BRIEF SUMMARY OF THE INVENTION

It is therefore an object of the present invention to provide an electrical connecting device having an excellent and stable current transfer characteristic.

It is a further object of the present invention to provide an electrical connecting device that has a simplified structure, that can be readily mass-produced, and that can be arranged in a fine pitch.

It is a further object of the present invention to provide a method of testing a semiconductor device under a condition of an excellent and stable current transfer characteristic.

Objects of the invention are achieved by an electrical connecting device comprising a contactor to electrically connect first and second electrodes and having a coil-shape spring, and a transformable conductive member extending in a compressing direction of the coil-shape spring, wherein one end of the conductive member is pressure contactable with the first electrode and the other end of the conductive member is pressure contactable with the second electrode to electrically connect the first and second electrodes when the coil-shape spring is compressed; and a guide plate having a through hole in which the contactor is positioned.

A current transfer path may be shortened and low resistance, low inductance and stable electrical transfer characteristic may be realized, and a contact pressure may also be generated with a coil-shape spring by establishing the electrical connection between the first electrode and second electrode via the conductive member in place of the coil-shape spring. Moreover, for electrical connection to a semiconductor device where many pins are arranged with a fine pitch, it can be realized easily that the electrical connecting device can have a plurality of through holes in the guide plate provided with a fine pitch and a plurality of corresponding contactors can be inserted thereto and thereby a low price and high performance electrical connecting device can be provided.

Further objects of the invention are achieved by a method of testing a semiconductor device comprising: loading a semiconductor device having a first electrode to an electrical connecting device, the electrical connecting device having a contactor with a coil-shape spring, a transformable conductive member extending in a compressing direction of the coil-shape spring, wherein one end of the conductive member is in contact with the first electrode of the semiconductor device and the other end of the conductive member is in contact with a second electrode to electrically connect the first electrode and the second electrodes when the coil-shape spring is compressed, and a guide plate having a through hole in which the contactor is positioned; connecting test equipment to the second electrode of the electrical connecting device; executing a test to the semiconductor device through the second electrode; and removing the semiconductor device from the electrical connecting device.

Since the stable and excellent electrical transfer characteristic can be provided via the conductive member, high precision testing of semiconductor devices can be achieved and deterioration of an electrical signal for testing can be prevented.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Reference will now be made in detail to the preferred embodiments of the present invention, examples of which are illustrated in the accompanying drawings, wherein like reference numerals refer to like elements throughout.

Figure 3A:
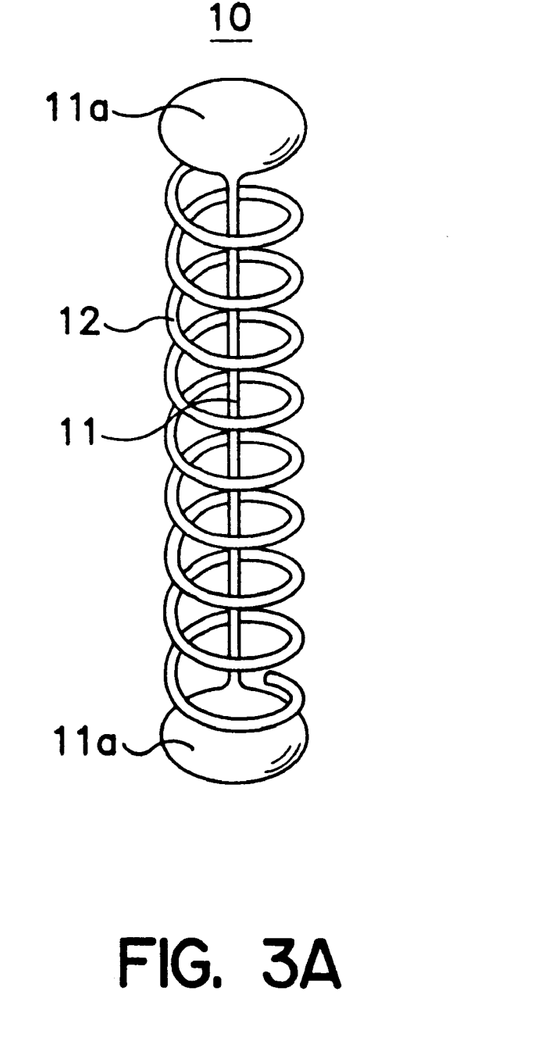
FIGS. 3A and 3B are diagrams showing a contactor for an electrical connecting device according to a preferred embodiment of the present invention.
Figure 3B:
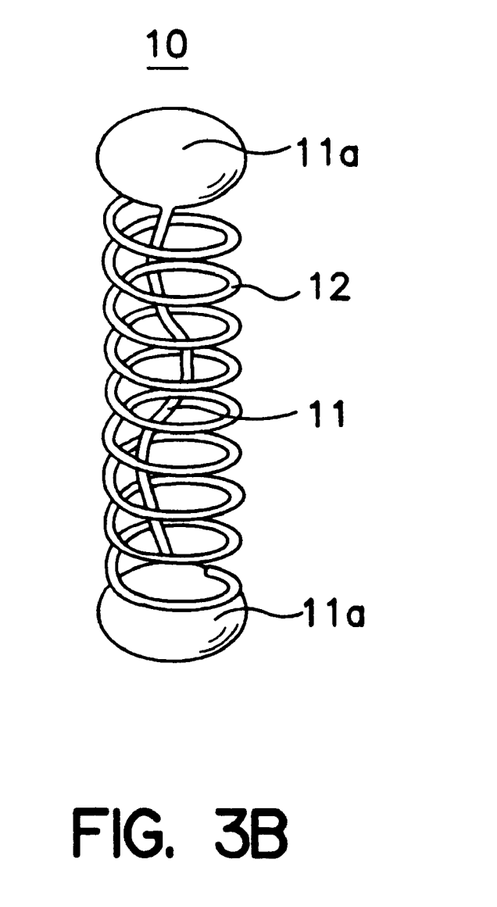
Figures 4A, 4B:
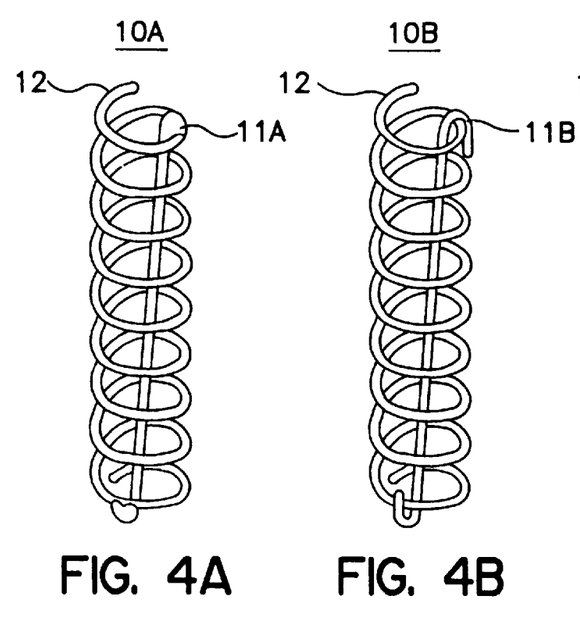
FIGS. 4A, 4B, 4C, 4D, 4E and 4F are diagrams showing further modified contactors for an electrical connecting device according to preferred embodiments of the present invention.
Figure 4C:
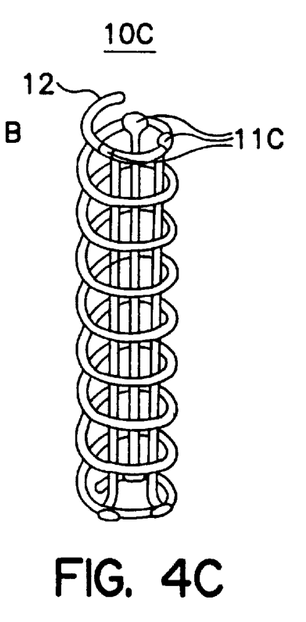
Figure 4D:
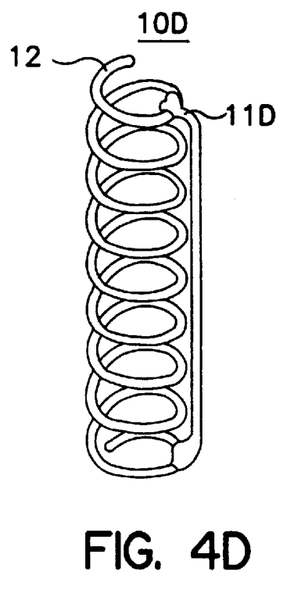
Figures 4E, 4F:
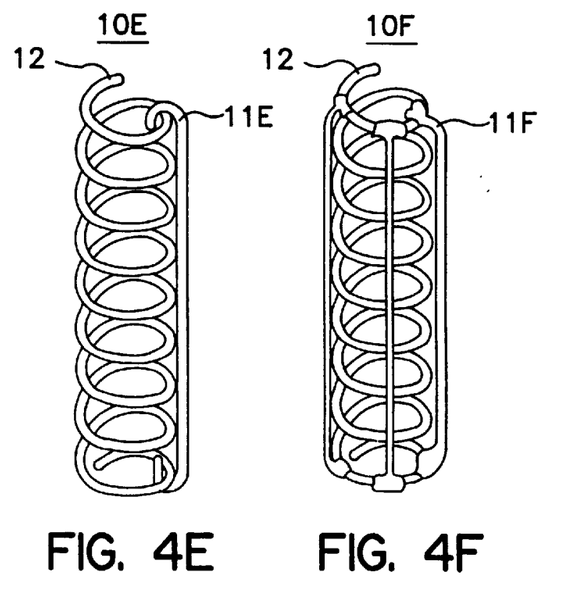

In accordance with a preferred embodiment of the invention, and as shown in FIGS. 3A and 3B, there is provided an electrical connecting device having a contactor 10. Contactor 10 of FIG. 3A includes an easily transformable, elongated conductive member 11 and a coil-shape spring 12. The conductive member 11 is provided within the coil-shape spring 12 along the longitudinal direction thereof and, for example, is formed of a metal wire to transfer current. At both ends of the conductive member 11, metal balls 11a or other similar disc-like contact elements are provided. The coil-shape spring 12 is compressed, as shown in FIG. 3B, when the metal ball 11a is in contact with an external electrode such as that of a semiconductor to provide a contact pressure. In this case when the spring 12 is compressed, the conductive member 11 deforms as shown in FIG. 3B.

The metal ball 11a has a diameter preferentially larger than the internal diameter of the coil-shape spring 12. In this manner, the conductive member 11 is never or not allowed to be removed from the coil-shape spring 12. Even when the coil-shape spring 12 is formed of a conductive material, current is transferred along the shortest route through the conductive member 11. Therefore, the coil-shape spring 12 may be formed of either a conductive material or a nonconductive material.

As explained, in the contactor for the electrical connecting device according to the preferred embodiment of the present invention, the coil-shape spring 12 provides elasticity to generate a contact pressure, while the transformable conductive member 11 provides a current transfer route. Since the route of the conductive member 11 is short, and in particular shorter than through the coil-shape spring, an excellent current transfer characteristic is realized resulting in small inductance and resistance. Moreover, since the current transfer route does not change even during contact with the external electrode, a stable current transfer characteristic also may be realized.

FIG. 4A to FIG. 4F show modifications to the contactor for the electrical connecting device in accordance with preferred embodiments of the present invention. In the contactor 10A of FIG. 4A, both ends of the conductive member 11A are welded to the coil-shape spring 12. In the contactor 10B of FIG. 12B, both ends of the conductive member 11B are fixedly hooked to the coil-shape spring 12. In the contactor 10C of FIG. 4C, a plurality of conductive members 11C are provided and both ends thereof are welded to the coil-shape spring 12. In the contactor 10D of FIG. 4D, the conductive member 11D is provided on the outside or at the external side of the coil-shape spring 12 and both ends thereof are welded to the coil-shape spring 12. In the contactor 10E of FIG. 4E, the conductive member 11E is arranged on the outside of the coil-shape spring 12 and both ends thereof are fixedly hooked to the coil-shape spring 12. In the contactor 10F of FIG. 4F, a plurality of conductive members 11F are arranged on the outside of the coil-shape spring 12 and both ends thereof are welded to the coil-shape spring 12.

The modified contactors of FIGS. 4A–4F operate and can achieve the same or similar functions as the contactor shown in FIGS. 3A and 3B and as described earlier. Particularly, for the contactors shown in FIG. 4C or FIG. 4F, when a plurality of conductive members are provided, resistance and inductance of the current transfer route may further be reduced in comparison with the case where only one conductive member is provided.

Figure 5A:
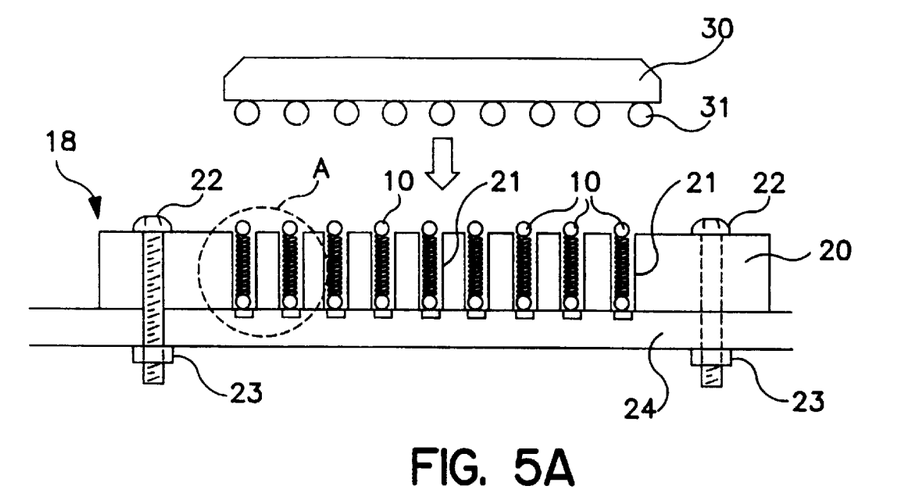
FIGS. 5A and 5B are diagrams showing an electrical connecting device according to a preferred embodiment of the present invention.
Figure 5B:
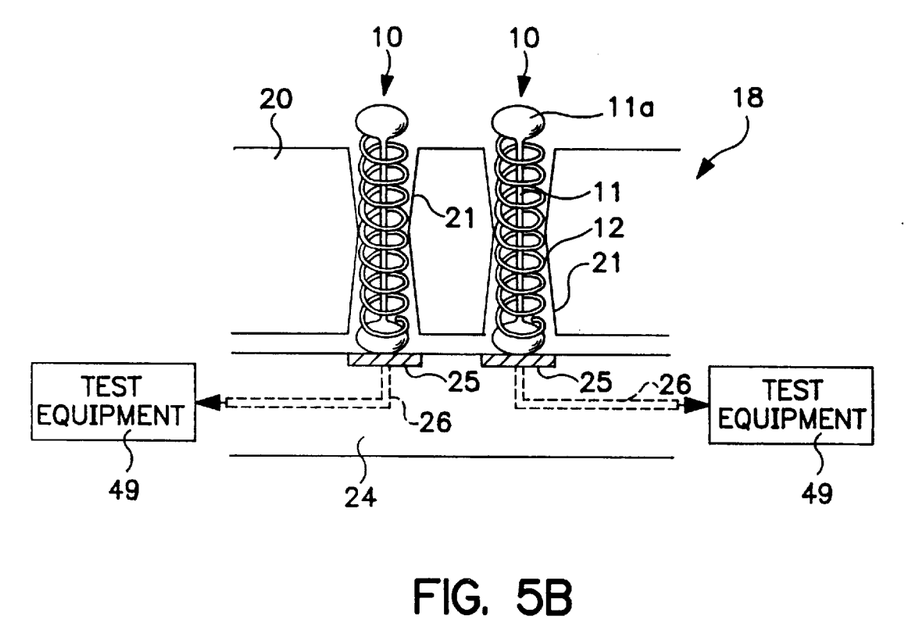

An electrical connecting device is shown in FIGS. 5A and 5B and now will be described hereafter in accordance with a preferred embodiment of the invention.

As shown in FIG. 5A, electrical connecting device 18 includes contactors 10, a guide plate 20, screws 22, screw stoppers 23 and a substrate 24. The guide plate 20 is provided with a plurality of holes 21 corresponding to the positions of the external electrodes 31 of a semiconductor device 30 and contactors 10 are positioned in the corresponding holes 21. Land patterns 25 are formed on one side of the substrate 24 to correspond with the holes 21 and contactors 10 located therein as shown in FIG. 5B. The guide plate 20 is fixed to the substrate 24 with the screws 22 and screw stoppers 23. Where the electrical connecting device 18 is applied to an IC package, the pitch of the electrical connecting device 18 can be 2.54 mm to as little as 0.5 mm in a particularly fine pitch, and the quantity of contactors accordingly could be from 10 to as many as 1,000. Where the electrical connecting device 18 is applied to a bare chip, the pitch of the electrical connecting device 18 can be 0.3 mm to as little as 0.04 mm in a particularly fine pitch, and the quantity of contactors accordingly could be a few to as many as a few thousands.

FIG. 5B is an enlarged view of portion "A" for the electrical connecting device shown in FIG. 5A. As shown in FIG. 5B, the contactors 10 are arranged within the holes 21 of the guide plate 20 so that these contactors 10 are in contact with corresponding land patterns 25. As embodied herein, hole 21 has an inwardly tapered internal wall where the internal diameter of the center area of the hole, for example, is narrowed as shown in FIG. 5B. Accordingly, the contactor 10 is prevented to be removed from the hole 21. The land pattern 25 is provided with a wiring 26 for connection with test equipment 49.

The electrical connecting device according to the preferred embodiment of the present invention can be electrically connected stably to the external electrode 31 of the semiconductor device 30 and the semiconductor device 30 can be tested easily by the test equipment 49. Moreover, since the structure of the contactors 10 and guide plate 20 is comparatively simple, it may be divided easily into small sections and it can be used with a semiconductor device 30 where a plurality of external electrodes 31 are arranged in a fine pitch.

Figure 6:
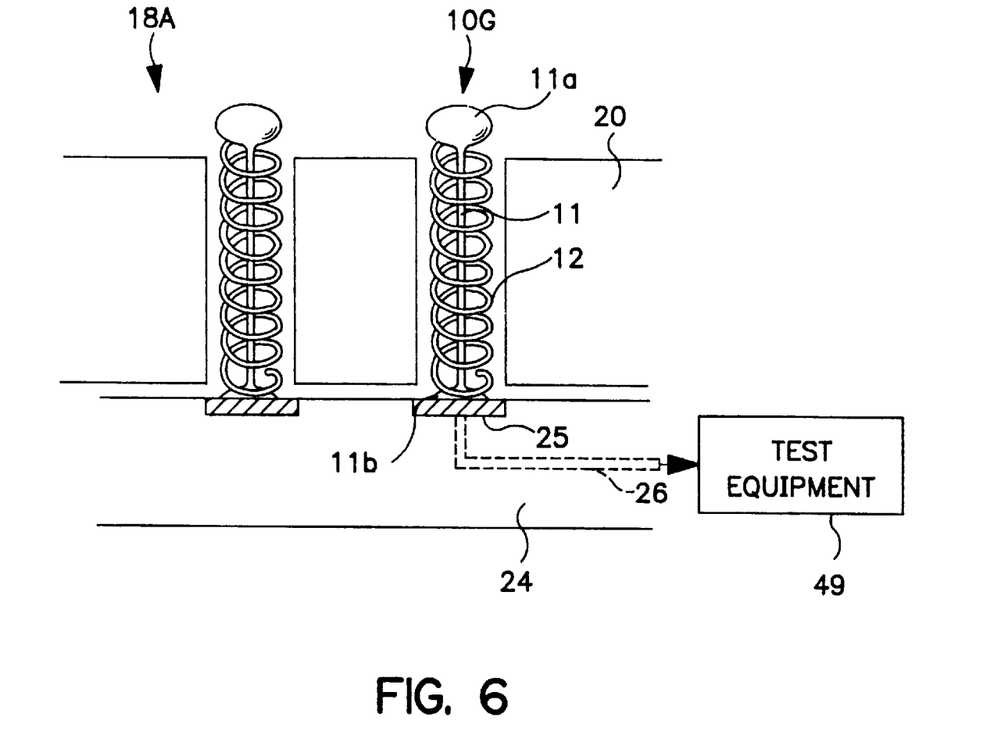
FIG. 6 is a diagram showing an electrical connecting device according to another preferred embodiment of the present invention.

An electrical connecting device 18A according to another preferred embodiment of the present invention is shown in FIG. 6 and will now be described. In FIG. 6, the elements like those elements for the device in FIGS. 5A and 5B are designated by like reference numerals and the same explanation is not repeated herein.

In the embodiment of the electrical connecting device 18A of FIG. 6, a contactor 10G is used in place of the contactor 10. In the embodiment of the device shown in FIG. 6, reliability of the electrical connection can be improved by mechanical coupling between the contactor 10G and land pattern 25. The contactor 10G is coupled to the land pattern 25 at the end part of the contactor using a metal coupling means. Such a metal coupling means, for example, could be a metal ball or disc-like element 11b fused using solder and fixedly coupled to the land pattern 25. As another example, a wire bonding technique can be applied. First, a ball at an end of a wire which is through a capillary is made using a hydrogen torch or electrical spark method. Next, the ball is secured at the land pattern 25 by mechanical pressure from the capillary and after the securing step, the wire is cut with appropriate length. Next, a coil-shape spring is provided around the remaining wire on the land pattern 25. Finally, a metal ball 11a is made using a hydrogen torch or electrical spark method. However, the metal coupling means need not be so limited to these examples.

Figure 7:
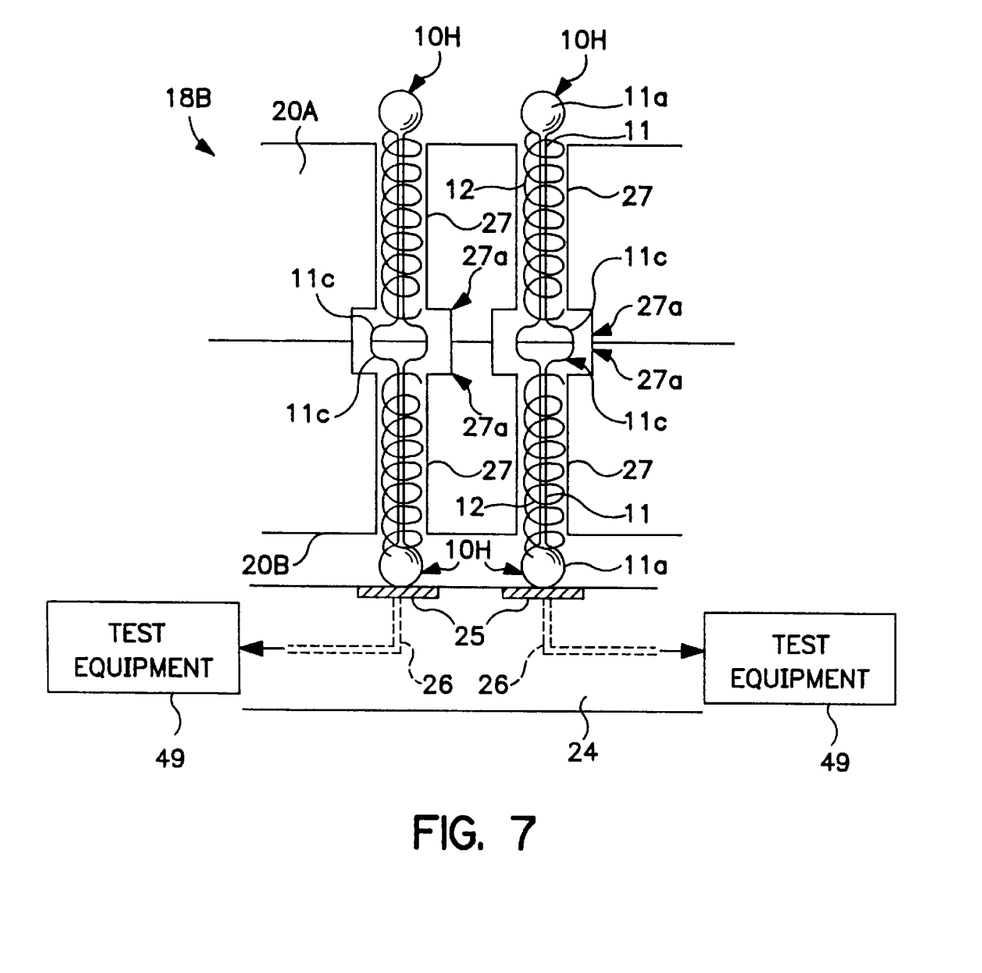
FIG. 7 is a diagram showing an electrical connecting device according to another preferred embodiment of the present invention.

An electrical connecting device 18B according to another preferred embodiment of the present invention is shown in FIG. 7 and will no be described. In FIG. 7, the elements like those elements for the device in FIGS. 5A and 5B are designated by like reference numerals and the same explanation is not repeated here.

In the embodiment of the electrical connecting device 18B in FIG. 7, two guide plates 20A and 20B having a plurality of corresponding holes 27 are stacked together. The corresponding holes 27 of the two guide plates have stepped portions 27a facing each other where the guide plates join together. Within the space formed by the stepped portion 27a of the guide plate 20A and the respective stepped portion 27a of the guide plate 20B, contactors 10H having connecting parts 11c connected in series are fitted therein. This arrangement prevents the contactor 10H from being removed from its respective hole 27.

Figure 8:
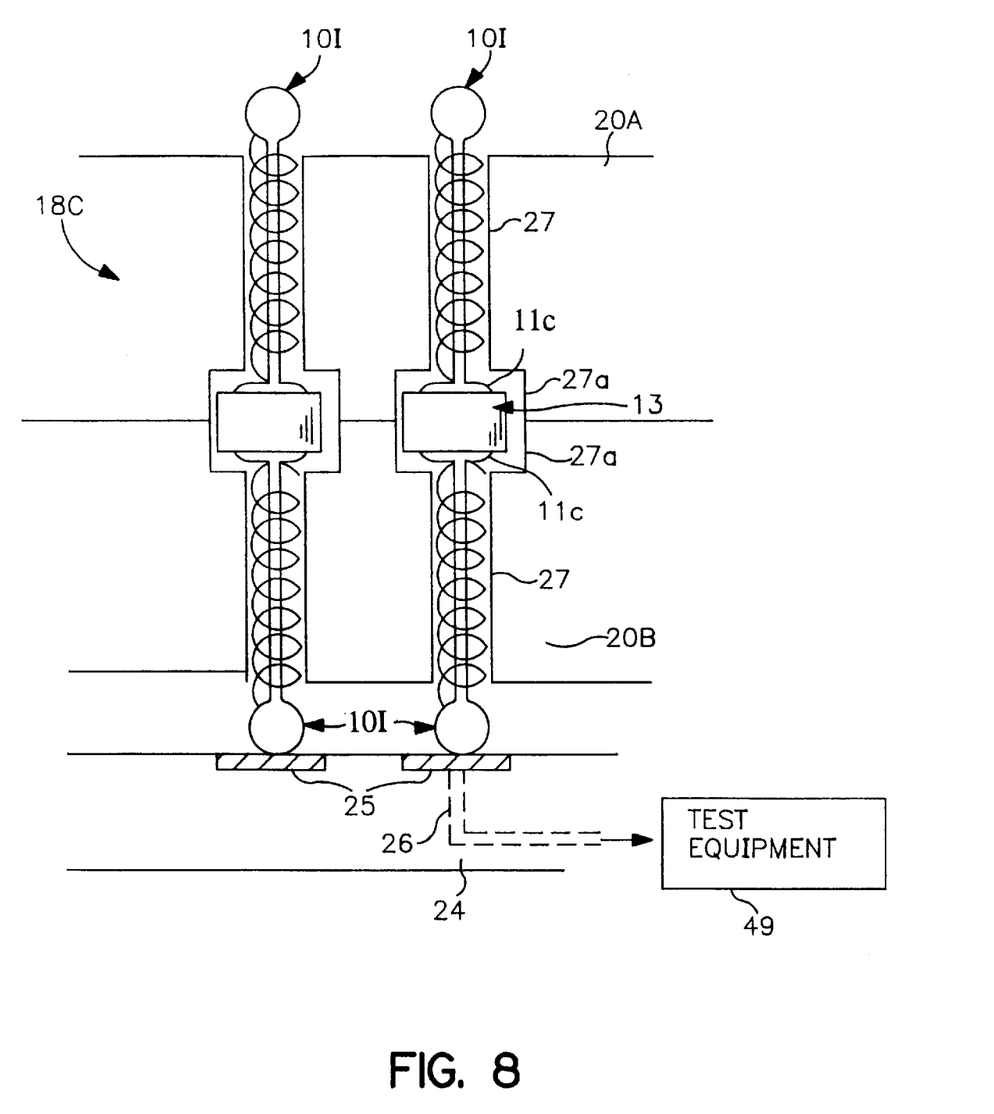
FIG. 8 is a diagram showing an electrical connecting device according to another preferred embodiment of the present invention.

An electrical connecting device 18C according another embodiment of the present invention is shown in FIG. 8 and will now be described below. In FIG. 8, the elements like those elements for the device in FIG. 7 are designated by like reference numerals and the same explanation is not repeated here.

In the embodiment of the electrical connecting device 18C of FIG. 8, two guide plates 20A and 20B having a plurality of corresponding holes 27 are again stacked together. The corresponding holes 27 of the two guide plates have stepped portions 27a facing each other where the guide plates join together. Within the space formed by the stepped portion 27a of the guide plate 20A and the stepped portion 27a of the guide plate 20B, a relaying member 13 is fitted therein. Contactors 101 have connecting parts 11c connected in series through the relaying member 13. This structure prevents the contactors 101 from being removed from the holes. The method of securing between the metal ball of the contactor 101 and land pattern 25 or relaying member 13 is the same as the securing method for the embodiment of FIG. 6.

Figure 9A:
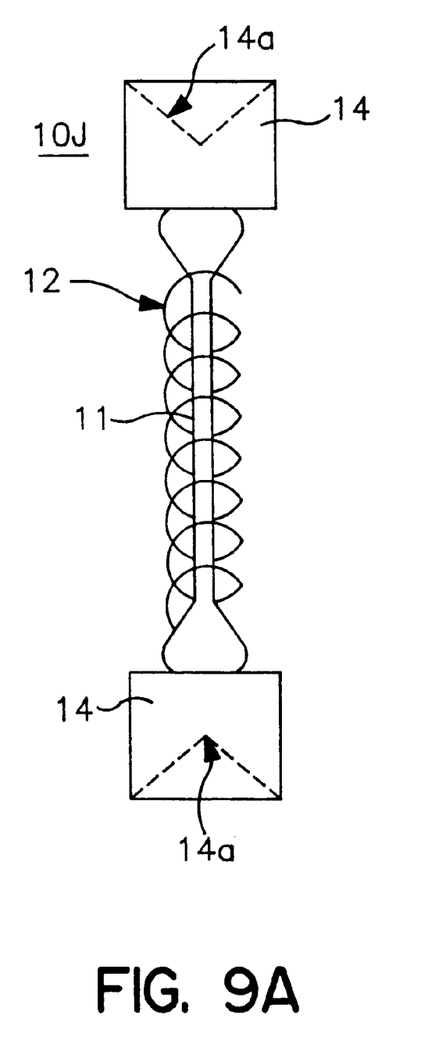
FIGS. 9A and 9B are diagrams showing further modified contactors for an electrical connecting device according to a preferred embodiment of the present invention.
Figure 9B:
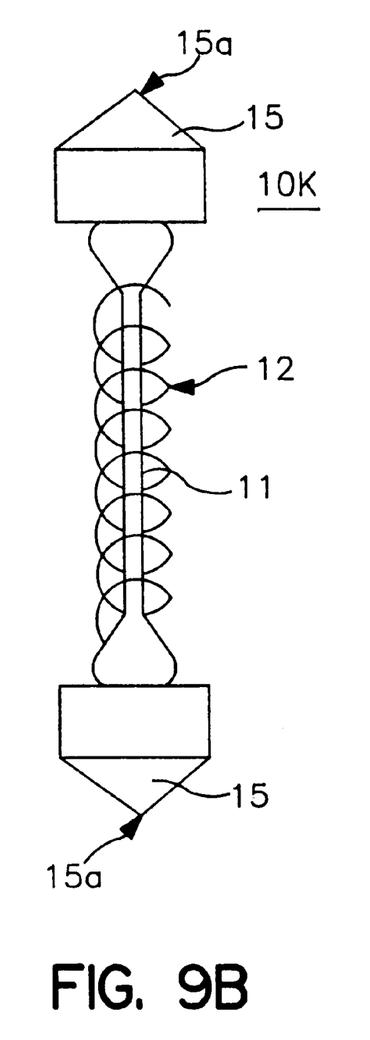

A contactor 10J and 10K having a modified structure for the electrical connecting device is shown in FIG. 9A and FIG. 9B according to another preferred embodiment of the present invention. In FIG. 9A and FIG. 9B, the elements of this contactor 10J and 10K that are like those elements of the contactor 10 in FIG. 3A and FIG. 3B are designated by like reference numerals and the same explanation is not repeated herein.

Contactor 10J of FIG. 9A includes a conductive member 11, a coil-shape spring 12 and a metal end piece 14 connected to both ends of the conductive member 11 for contact. As shown in FIG. 9A, the metal end piece 14 for contact has a recess 14a and reliable electrical connection can be established by fitting a ball type external electrode of a Ball-Grid-Array ("BGA") type semiconductor device into the recess 14a.

The further modified contactor 10K of FIG. 9B includes a conductive member 11, a coil-shape spring 12 and a metal end piece 15 connected to both ends of the conductive member 11 for contact. As shown in FIG. 9B, the metal end piece 15 for contact has a sharp end point 15a and reliable electrical connection can be established by pushing the end point 15a to a pin type external electrode of a Quadrille-Flat-Package ("QFP") type semiconductor device and to the electrode like the land pattern 25 of the substrate 24 for the device of FIG. 5B.

In the contactors shown FIG. 9A and FIG. 9B, as explained above, reliable electrical connection can be established by providing the metal end piece for contact suitable for the shape of the electrode to be connected. It is not required to provide a metal end piece for contact having the same shape at both ends of the contactor. For example, the metal end piece 14 for contact in the contactor of FIG. 9A can be provided at one end and the metal end piece 15 for contact in the contactor of FIG. 9B can be provided at the other end.

Figure 10:
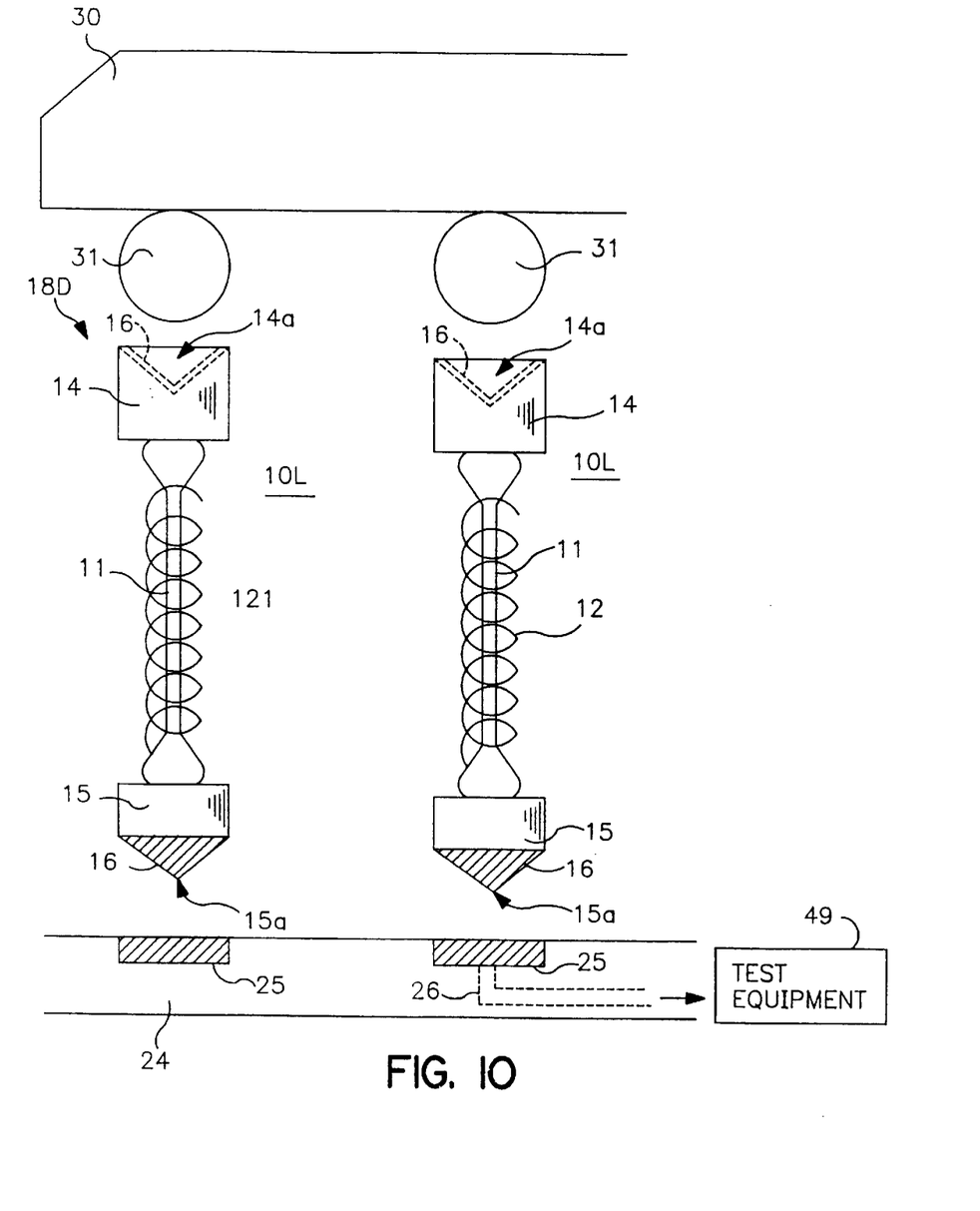
FIG. 10 is a diagram showing a connection profile for an electrical connecting device using the contactor of the type shown in FIG. 9A and FIG. 9B.

FIG. 10 is a schematic view showing a connection for an electrical connecting device using a contactor having metal end pieces of the types shown in FIG. 9A and FIG. 9B. In FIG. 10, the elements for the device like those in FIG. 5A and FIG. 5B, and FIG. 9A and FIG. 9B are designated by like reference numerals and the same explanation is not repeated here.

In this electrical connecting device 18D of FIG. 10, contactors 10L have the metal end piece 14 for contact provided at one end and the metal end piece 15 for contact at the other end. Moreover, the recess 14a of the metal end piece 14 for contact and the sharp end point or end part 15a of the metal end piece 15 for contact are respectively provided with a metal plating 16 of Au to improve the electrical connection.

The ball-type external electrode 31 of the semiconductor device 30 is positioned into the recess 14a of the metal end piece 14 for contact, while the end part 15a of the metal end piece 15 for contact is pushed into contact with the land pattern 15 of the substrate 24. Thereby, reliable electrical connection can be established between the ball type external electrode 31 of the semiconductor device 30 and the land pattern 25.

A method for manufacturing a contactor for an electrical connecting device in accordance with a preferred embodiment of the invention is shown in FIGS. 11A–11D and will now be described below.

Figure 11A:
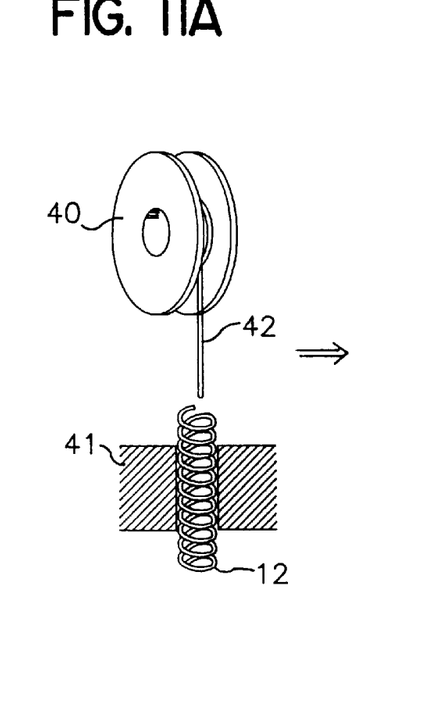
FIGS. 11A–11D are diagrams showing a method of manufacturing a contactor shown in FIG. 3A according to a preferred embodiment of the invention.
Figure 11B:
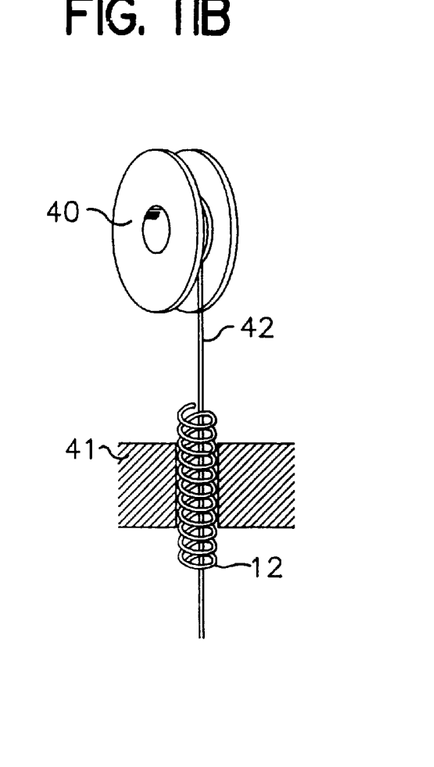
Figure 11C:
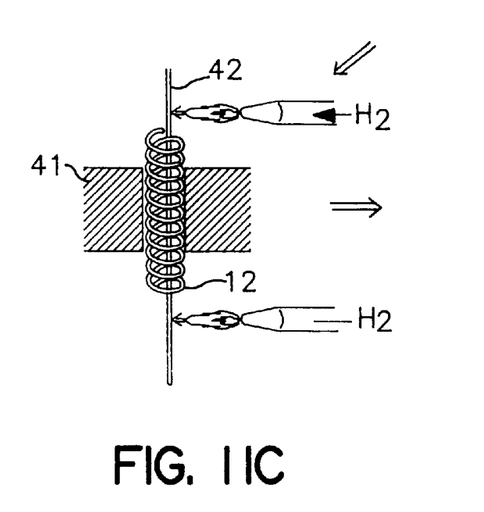
Figure 11D:
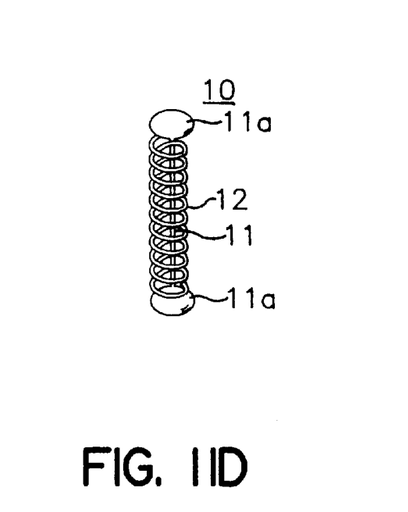

As shown in FIG. 11A, in making the contactor 10 a wire 42 is fed from a wire reel 40 and is then inserted into the inside portion of the coil-shape spring 12 which is fixed to a clamping jig 41. FIG. 11B shows the condition in the subsequent step where the wire 42 is inserted into the coil-shape spring 12. In this condition and in the next step shown in FIG. 11C, the wire 42 is thermally cut at both ends of the coil-shape spring 12, for example, by a hydrogen torch method. The wire 42 also may be thermally cut, for example, by an electrical discharging process. When the wire 42 is thermally cut, and as shown in the subsequent step of FIG. 11D, the wire 42 is hardened in the form of a sphere at the cutting end, to provide the conductive member 11 inserted into the coil-shape spring 12 and with metal balls or similar disc-like elements 11a at both ends of the conductive member 11.

As explained above, the contactor and the other components for the electrical connecting device according to preferred embodiments of the present invention may be produced easily by simple processes which are quite suitable for mass-production.

Figure 12:
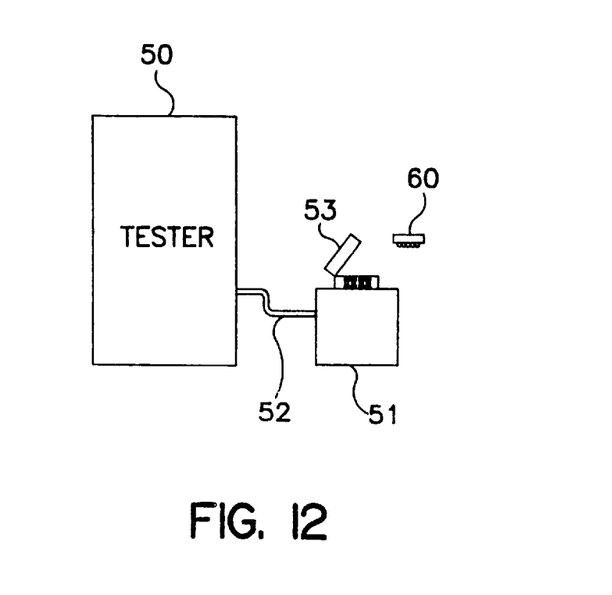
FIG. 12 is a diagram showing a structure for a semiconductor device test system using the electrical connecting device according to a preferred embodiment of the present invention.

As will now be described and as illustrated in FIG. 12, there is provided an arrangement for semiconductor device test equipment utilizing the electrical connecting device according to embodiments of the present invention.

The semiconductor device test equipment shown in FIG. 12 includes a tester 50, a test head 51, a wiring 52 connecting the test head 51 and tester 50 and a contactor 53 using the electrical connecting device according to an embodiment of the present invention provided at the test head 51. An LSI 60 is fitted to the contactor 53 to test the LSI 60, for example a BGA type LSI, with the tester 50. The semiconductor device test equipment of FIG. 12 is available in the related art, except for use of the electrical connecting device of the present invention, for example, the embodiment of the device shown in FIG. 5A. Therefore, a detailed explanation thereof is omitted herein.

A method for testing a semiconductor device utilizing the semiconductor device test equipment in FIG. 12 now be described in accordance with a preferred embodiment of the invention. The semiconductor testing method is also illustrated in FIGS. 13A through 13C.

Figure 13A:
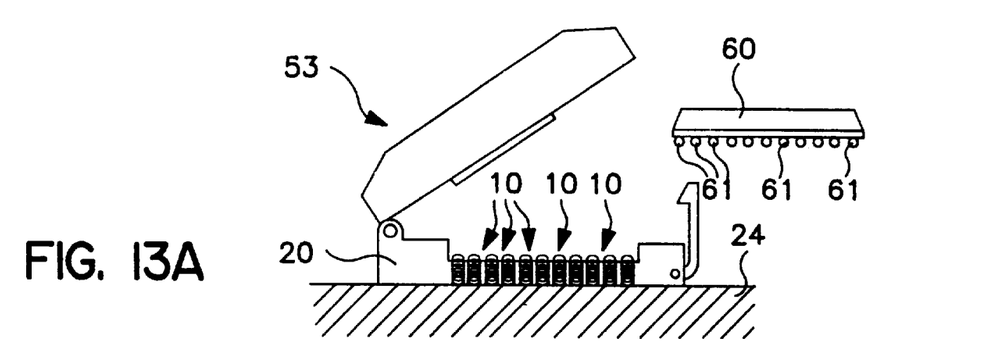
FIGS. 13A–13C are diagrams showing a method for testing a semiconductor device according to a preferred embodiment of the invention.
Figure 13B:
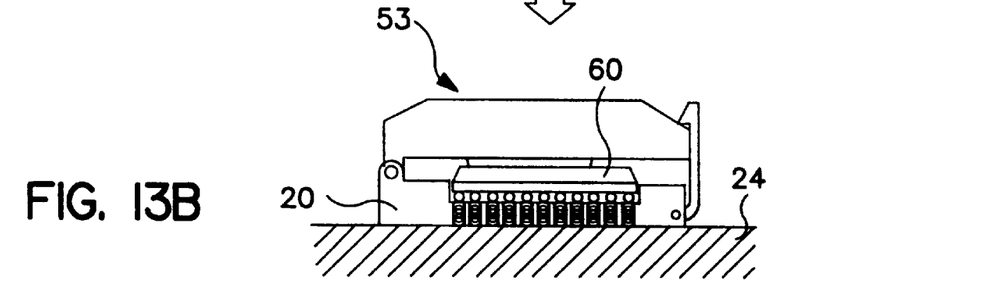
Figure 13C:
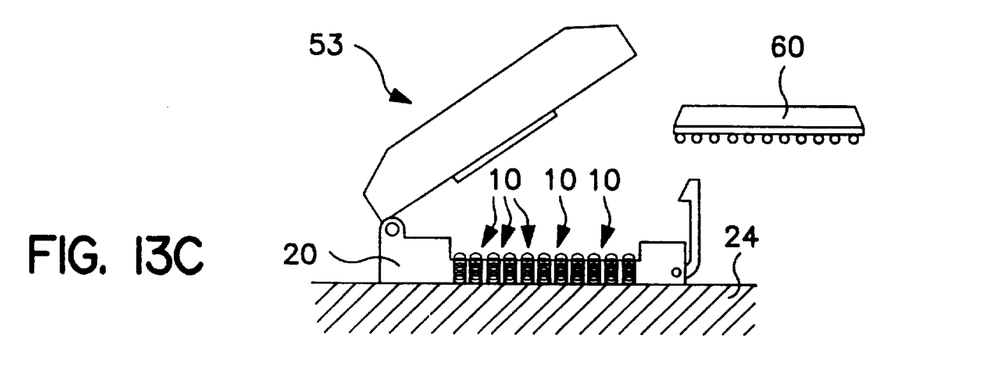

In FIG. 13A through FIG. 13C, the elements of the electrical connecting device used in this testing method that are like those elements of the electrical connecting device in FIG. 5A and FIG. 5B are designated by like reference numerals and the same explanation is not repeated here.

As shown in FIG. 13A, this testing method uses a contactor 53 which includes a guide plate 20 arranging contactors 10 corresponding to an arrangement of external electrodes 61 of LSI 60. The electrical connection between the external electrode 61 and contactor 10 is established by inserting the LSI 60 into the contactor 53. FIG. 13B shows the condition or subsequent step where the LSI 60 is inserted into the contactor 53. Under this condition, various electrical tests are executed on LSI 60 using the appropriate test equipment. After the test, in the next step, the LSI 60 is removed from the contactor 43 as shown in FIG. 13C.

As explained above, this method of testing a semiconductor device can be executed under a stable and excellent electrical connecting condition, while the semiconductor device is loaded or unloaded easily. These advantages of conducting the semiconductor device test according to the processes shown in FIG. 13A through FIG. 13C are achievable by using the semiconductor test system shown in FIG. 12 provided with an electrical connecting device according to the present invention.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. An electrical connecting device comprising:
   a contactor to electrically connect first and second electrodes and having
      a coil-shape spring, and
      a transformable conductive member extending in a compressing direction of the coil-shape spring, wherein one end of the conductive member is pressure contactable with the first electrode and the other end of the conductive member is pressure contactable with the second electrode to electrically connect the first and second electrodes when the coil-shape spring is compressed and the conductive member is formed as a single piece structure from the one end to the other end thereof; and
   a guide plate having a through hole in which the contactor is positioned.

2. An electrical connecting device as set forth in claim 1, wherein the conductive member has a middle portion extending in the compressing direction of the coil-shape spring within the coil-shape spring and end portions larger than the internal diameter of the coil-shape spring.

3. An electrical connecting device as set forth in claim 1, wherein the conductive member has a middle portion extending in the compressing direction of the coil-shape spring within the coil-shape spring and has end portions connected to corresponding end portions of the coil-shape spring.

4. An electrical connecting device as set forth in claim 1, wherein the conductive member has a middle portion extending in the compressing direction of the coil-shape spring on the outside of the coil-shape spring and has end portions connected to corresponding end portions of the coil-shape spring.

5. An electrical connecting device as set forth in claim 1, further comprising metal members, provided at both ends of the conductive member, to contact the first and second electrodes and to provide electrical connection thereto.

6. An electrical connecting device as set forth in claim 5, wherein at least one metal member has a recess to position a corresponding electrode therein for contact.

7. An electrical connecting device as set forth in claim 5, wherein at least one metal member has a sharp end point to press toward and contact the corresponding electrode.

8. An electrical connecting device as set forth in claim 1, wherein the through hole has a tapered internal wall.

9. An electrical connecting device as set forth in claim 1, wherein a plurality of contactors are arranged in series within a plurality of corresponding through holes.

10. An electrical connecting device as set forth in claim 9, comprising at least two guide plates positioned together and having a plurality of through holes with stepped portions at sides of the guide plates positioned together and at least two contactors arranged in corresponding through holes of the two guide plates are connected at corresponding ends in the stepped portions.

11. An electrical connecting device as set forth in claim 9, comprising at least two guide plates positionable together and having a plurality of through holes with the stepped portions at sides of the guide plates positioned together, relaying members, and at least two contactors arranged in corresponding through holes of the two guide plates and connected by the relaying members in the stepped portions.

12. An electrical connecting device as set forth in claim 1, further comprising a substrate having a land pattern forming the second electrode and contacting one end of the conductive member of the contactor.

13. An electrical connecting device as set forth in claim 12, wherein the land pattern is electrically connectable to test equipment and a semiconductor device to be tested is formed with the first electrode that is positionable for pressure contact with the other end of the conductive member.

14. A contactor to electrically connect first and second electrodes comprising:
   a coil-shape spring, and
   a transformable conductive member extending in a compressing direction of the coil-shape spring, wherein one end of the conductive member is pressure contactable with the first electrode and the other end of the conductive member is pressure contactable with the second electrode to electrically connect the first and second electrodes when the coil-shape spring is compressed and the conductive member is formed as a single piece structure from the one end to the other end thereof.

15. A contactor as set forth in claim 14, wherein the conductive member has a middle portion extending in the compressing direction of the coil-shape spring within the coil-shape spring and end portions larger than the internal diameter of the coil-shape spring.

16. An electrical connecting device as set forth in claim 14, wherein the conductive member has a middle portion extending in the compressing direction of the coil-shape spring within the coil-shape spring and has end portions connected to corresponding end portions of the coil-shape spring.

17. An electrical connecting device as set forth in claim 14, wherein the conductive member has a middle portion extending in the compressing direction of the coil-shape spring on the outside of the coil-shape spring and has end portions connected to corresponding end portions of the coil-shape spring.

18. An electrical connecting device as set forth in claim 14, further comprising metal members, provided at both ends of the conductive member, to contact the first and second electrodes and to provide electrical connection thereto.

19. An electrical connecting device as set forth in claim 18, wherein at least one metal member has a recess to position a corresponding electrode therein for contact.

20. An electrical connecting device as set forth in claim 18, wherein at least one metal member has a sharp end point to press toward and contact the corresponding electrode.

21. An electrical connecting device comprising:
   a contactor to electrically connect first and second electrodes and having
      a coil-shape spring, and
      a transformable conductive member extending in a compressing direction of the coil-shape spring, wherein one end of the conductive member is pressure contactable with the first electrode and the other end of the conductive member is pressure contactable with the second electrode to electrically connect the first and second electrodes when the coil-shape spring is compressed; and
   a guide plate having a through hole in which the contactor is positioned, wherein a plurality of contactors are arranged in series within a plurality of corresponding through holes, at least two guide plates are positioned together and have a plurality of through holes with stepped portions at sides of the guide plates positioned together and at least two contactors arranged in corresponding through holes of the two guide plates are connected at corresponding ends in the stepped portions.

22. An electrical connecting device comprising:
   a contactor to electrically connect first and second electrodes and having
      a coil-shape spring, and
      a transformable conductive member extending in a compressing direction of the coil-shape spring, wherein one end of the conductive member is pressure contactable with the first electrode and the other end of the conductive member is pressure contactable with the second electrode to electrically connect the first and second electrodes when the coil-shape spring is compressed; and
   a guide plate having a through hole in which the contactor is positioned, wherein a plurality of contactors are arranged in series within a plurality of corresponding through holes, at least two guide plates are positionable together and have a plurality of through holes with the stepped portions at sides of the guide plates positioned together, relaying members, and at least two contactors are arranged in corresponding through holes of the two guide plates and connected by the relaying members in the stepped portions.

* * * * *

UNITED STATES PATENT AND TRADEMARK OFFICE
CERTIFICATE OF CORRECTION

PATENT NO. : 6,033,233
DATED : March 7, 2000
INVENTOR(S) : Makoto Haseyama et al.

It is certified that error appears in the above-indentified patent and that said Letters Patent is hereby corrected as shown below:

On the title page, and column 1. delete "AND SEMICONDUCTOR DEVICE TESTING METHOD--.

On the title page, [56] References Cited, Other Publications, change "VI. 33" to --Vol. 33--.

Signed and Sealed this

Tenth Day of April, 2001

*Attest:*

NICHOLAS P. GODICI

*Attesting Officer*  *Acting Director of the United States Patent and Trademark Office*